(12) United States Patent  (10) Patent No.: US 8,208,883 B2
Jeong et al.  (45) Date of Patent: Jun. 26, 2012

(54) RECEIVER WITH LOW POWER CONSUMPTION

(75) Inventors: Seong-heon Jeong, Seoul (KR); Sung-ho Beck, Seongnam-si (KR); Myung-woon Hwang, Seoul (KR)

(73) Assignee: Silicon Motion, Inc., Zhubei (TW)

( * ) Notice: Subject to any disclaimer, the term of this patent is extended or adjusted under 35 U.S.C. 154(b) by 480 days.

(21) Appl. No.: 12/369,948

(22) Filed: Feb. 12, 2009

(65) Prior Publication Data

US 2009/0209221 A1  Aug. 20, 2009

(30) Foreign Application Priority Data

Feb. 14, 2008 (KR) .................. 10-2008-0013267

(51) Int. Cl.
*H04B 1/06* (2006.01)
*H04B 7/00* (2006.01)
(52) U.S. Cl. .................. 455/232.1; 455/234.1
(58) Field of Classification Search ............... 455/232.1, 455/234.1
See application file for complete search history.

(56) References Cited

U.S. PATENT DOCUMENTS

| 6,278,325 | B1 * | 8/2001 | Juang | 330/285 |
| 6,683,925 | B1 * | 1/2004 | Katsura et al. | 375/345 |
| 6,968,166 | B2 * | 11/2005 | Yang | 455/234.1 |
| 6,993,291 | B2 * | 1/2006 | Parssinen et al. | 455/67.11 |
| 7,292,101 | B2 * | 11/2007 | Kocaman et al. | 330/254 |
| 7,469,134 | B2 * | 12/2008 | Yoshizawa et al. | 455/234.2 |
| 7,676,206 | B2 * | 3/2010 | Ragan et al. | 455/232.1 |
| 2003/0181179 | A1 * | 9/2003 | Darabi | 455/234.1 |
| 2004/0061554 | A1 * | 4/2004 | Kajiwara et al. | 330/133 |
| 2004/0218576 | A1 | 11/2004 | Imagawa et al. | |
| 2005/0107054 | A1 * | 5/2005 | Nakayama | 455/234.1 |
| 2007/0026837 | A1 * | 2/2007 | Bagchi | 455/333 |

FOREIGN PATENT DOCUMENTS

CN  1529947  9/2004

* cited by examiner

*Primary Examiner* — Quan Tra
(74) *Attorney, Agent, or Firm* — Kirton McConkie; Evan R. Witt

(57) ABSTRACT

The present invention provides a receiver with low power consumption. The receiver with low power consumption adjusts the gain of the programmable gain amplifier based on the automatic gain controller and further optimizes the gain bandwidth product by current-adjusting unit. The current-adjusting unit thus adjusts the current provided for the programmable gain amplifier, e.g. operational amplifier. Therefore, the gain bandwidth product of the programmable gain amplifier is optimized and the power consumption of the receiver is effectively decreased.

4 Claims, 5 Drawing Sheets

RECEIVER WITH LOW POWER CONSUMPTION

FIELD OF THE INVENTION

The present invention relates to a receiver in a communication system, and more particularly to a receiver with low power consumption, wherein the receiver with low power consumption controls the gain of a programmable gain amplifier (PGA) based on the automatic gain control, and a current-adjusting unit optimizes the gain bandwidth for adjusting the current provided for the programmable gain amplifier (PGA) in order to minimize the power consumption of the receiver.

BACKGROUND OF THE INVENTION

As shown in FIG. 1, it is a schematic block diagram of a conventional receiver 100 with a programmable gain amplifier 105. The receiver 100 includes an antenna 101, a low noise amplifier (LNA) 102, a frequency converter 103, a channel selection filter (CSF) 104 and a programmable gain amplifier (PGA) 105.

The receiver 100 receives the ultra-high signal by the antenna 101 and the low noise amplifier (LNA) 102 amplifies the received signal. The frequency converter 103 down-converts the frequency of the received signal. The channel selection filter (CSF) 104 filters away the interference signal of the received signal. The programmable gain amplifier (PGA) 105 composed of amplifiers amplifies the received signal and outputs a signal at a predetermined value.

The receiver 100 further includes a radio frequency automatic gain control (RF AGC) 107 and an intermediate frequency automatic gain control (IF AGC) 108. The radio frequency automatic gain control (RF AGC) 107 automatically adjusts the gain of the low noise amplifier (LNA) 102 and the frequency converter 103 to maintain the ultra-high signal before being inputted to the channel selection filter (CSF) 104 at a predetermined value. The intermediate frequency automatic gain control (IF AGC) 108 automatically adjusts the gain of the channel selection filter (CSF) 104 and the programmable gain amplifier (PGA) 105 to maintain the signal after being outputted from the channel selection filter (CSF) 104 at a predetermined value.

While the signal inputted to the programmable gain amplifier (PGA) 105 is too low, the programmable gain amplifier (PGA) 105 increases the gain for the signal under the control of the intermediate frequency automatic gain control (IF AGC) 108. While the signal inputted to the programmable gain amplifier (PGA) 105 is too high, the programmable gain amplifier (PGA) 105 decreases the gain for the signal to maintain the signal at the predetermined value.

Please refer to FIG. 2. It is a schematic view of a conventional programmable gain amplifier (PGA) 105 implemented by operational amplifiers. The programmable gain amplifier (PGA) 105 includes a first operational amplifier 201, a second amplifier 202, and a plurality of resistors R201, R202, and R203.

The transfer function of the programmable gain amplifier (PGA) 105 is represented as formula 1 (E1):

$$\frac{V_o}{V_i} = \frac{R_{202} R_{204}}{R_{201} R_{203}} \quad (E1)$$

where Vo=Vop−Vom, Vi=Vip−Vim, and the programmable gain amplifier (PGA) 105 performs mapping for the gain which is inversely proportional to the input signal in the communication system. In the programmable gain amplifier (PGA) 105, the high level signal is corresponding to low gain, and low level signal is corresponding to high gain so that the outputted signal is maintained at the predetermined value. The frequency bandwidth, noise characteristic, 1 dB output gain compression point, and $3^{rd}$ output intercept point (OIP3) meet the specification requirement of the communication system.

Generally, if the programmable gain amplifier (PGA) 105 has to be operated in a high gain status, the operational amplifier with high gain bandwidth product is required in order to satisfy the requirement of predetermined bandwidth. Conversely, if the programmable gain amplifier (PGA) 105 has to be operated in a low gain status, the operational amplifier with low gain bandwidth product can be used to satisfy the requirement of specific bandwidth. Please refer to FIG. 5. It is a schematic view of the relationship between the gain and frequency bandwidth of the conventional programmable gain amplifier (PGA) 105. The relationship between the gain and frequency bandwidth (BW) of the programmable gain amplifier (PGA) 105 is represented as formula 2 (E2), and the gain is inversely proportional to the frequency bandwidth (BW):

$$\text{Gain} = \frac{1}{BW} \quad (E2)$$

For the same operational amplifier, the frequency bandwidth (BW) is decreased when the gain of the programmable gain amplifier 105 is increased. For the design purpose of characteristic requirement, specifically bandwidth, of the programmable gain amplifier (PGA) 105 in a communication system, the programmable gain amplifier (PGA) 105 is constructed as the following design rule. In the worst case, the programmable gain amplifier (PGA) 105 is designed on the basis of the high gain rule first, and the gain bandwidth product is then determined.

For the purpose of high gain bandwidth product, the greater current is provided to the operational amplifiers thereby the programmable gain amplifier (PGA) 105 is operated in the status of high gain. Even though the programmable gain amplifier (PGA) 105 is only required to be operated in the status of low gain, or the outputted signal of the programmable gain amplifier (PGA) 105 is maintained at the predetermined value, the greater current is always provided to the operational amplifiers, thereby resulting in excessive power consumption with respect to the receiver 100.

Notwithstanding the programmable gain amplifier (PGA) 105 has to be operated in high gain in only a few cases that the inputted signal is in very low level, it is necessary to provide the greater current for the programmable gain amplifier (PGA) 105 all the time. In addition, the gain of the programmable gain amplifier (PGA) 105 is designed by a gain margin so that the greater current is provided for the programmable gain amplifier (PGA) 105 all the time. Therefore, it is required to supply more current to the programmable gain amplifier (PGA) 105, thereby resulting in a problem of unnecessary power consumption.

SUMMARY OF THE INVENTION

The first objective of the present invention is to provide a receiver with low power consumption. The receiver with low power consumption controls the gain of a programmable gain amplifier (PGA) based on the automatic gain control. A current-adjusting unit optimizes the gain bandwidth product for adjusting the current exerted on the first stage amplifier of at least two stage amplifiers in the programmable gain amplifier (PGA) based on the gain bandwidth product in order to minimize the power consumption of the receiver due to undue current.

According to the above objective, the present invention sets forth a receiver with low power consumption. The receiver includes an antenna, a low noise amplifier (LNA), a frequency converter, a channel selection filter (CSF), a programmable gain amplifier (PGA), a radio frequency automatic gain control (RF AGC), and an intermediate frequency automatic gain control (IF AGC). The low noise amplifier (LNA) amplifies an ultra-high frequency signal received from the antenna. The frequency converter down-converts a frequency of the ultra-high frequency signal. The channel selection filter (CSF) filters away an interference signal from the down-converted signal from the channel selection filter. The programmable gain amplifier (PGA) amplifies the down-converted signal for outputting a gain-amplified signal having a predetermined constant value to the output end. The intermediate frequency automatic gain control (IF AGC) generates intermediate frequency automatic gain control information based on an inputted signal of the programmable gain amplifier to adjust the gain of the programmable gain amplifier (PGA).

The receiver further includes a current-adjusting unit. The current-adjusting unit is coupled to the intermediate frequency automatic gain control (IF AGC) and the programmable gain amplifier (PGA). The current-adjusting unit receives the intermediate frequency automatic gain control information and determines an optimal gain bandwidth product of the programmable gain amplifier according to the intermediate frequency automatic gain control information. The current-adjusting unit further adjusts the current of the programmable gain amplifier (PGA) based on the optimal gain bandwidth product, wherein the optimal gain bandwidth product includes a first gain bandwidth product and a second gain bandwidth product which is less than the first gain bandwidth product.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 6:
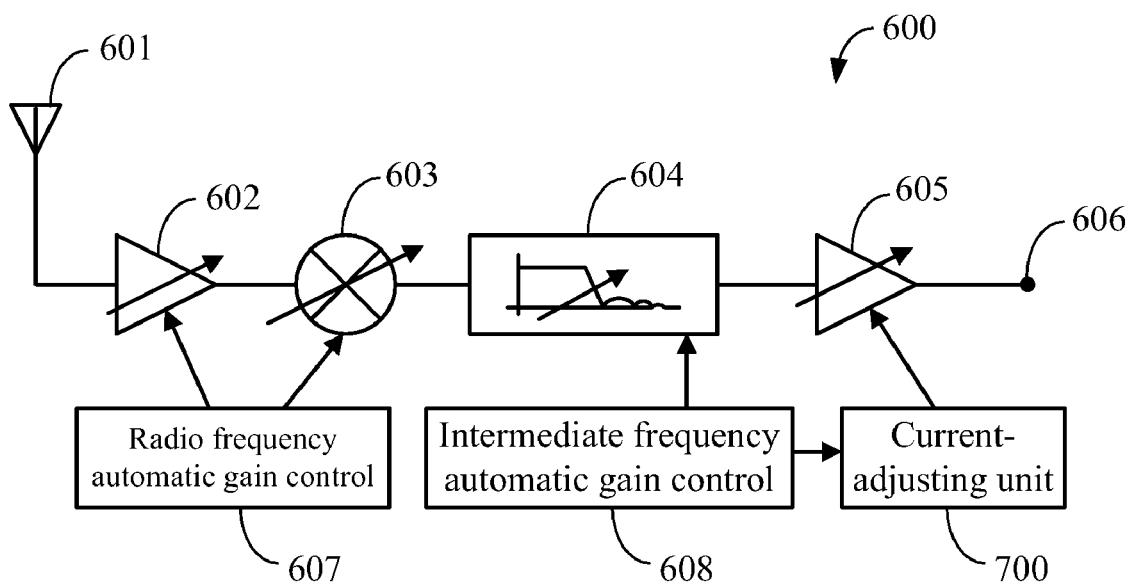
FIG. 6 is a schematic block diagram of a receiver with a current-adjusting unit according to one embodiment of the present invention.

Please refer to FIG. 6. It is a schematic block diagram of a receiver 600 with a current-adjusting unit for reducing power consumption by optimizing the gain bandwidth product according to one embodiment of the present invention. The receiver 600 includes an antenna 601, a low noise amplifier (LNA) 602, a frequency converter 603, a channel selection filter (CSF) 604, a programmable gain amplifier (PGA) 605, a radio frequency automatic gain control (RF AGC) 607, and an intermediate frequency automatic gain control (IF AGC) 608. The low noise amplifier (LNA) 602 amplifies an ultra-high frequency signal received from the antenna 601. The frequency converter 603 down-converts a frequency of the ultra-high frequency signal. The channel selection filter (CSF) 604 filters away an interference signal from the down-converted signal. The programmable gain amplifier (PGA) 605 amplifies the down-converted signal from channel selection filter (CSF) 604 for outputting a gain-amplified signal having a predetermined constant value to the output end 606. The intermediate frequency automatic gain control (IF AGC) 608 generates intermediate frequency automatic gain control information based on an inputted signal of the programmable gain amplifier (PGA) 605 to adjust the gain of the programmable gain amplifier (PGA) 605. The receiver 600 further includes a current-adjusting unit 700. The current-adjusting unit 700 is coupled to the intermediate frequency automatic gain control (IF AGC) 608 and the programmable gain amplifier (PGA) 605. The current-adjusting unit 700 receives the intermediate frequency automatic gain control information and determines an optimal gain bandwidth product of the programmable gain amplifier according to the intermediate frequency automatic gain control information. The current-adjusting unit 700 further adjusts the current of the programmable gain amplifier (PGA) 605 based on the optimal gain bandwidth product, wherein the optimal gain bandwidth product includes a first gain bandwidth product and a second gain bandwidth product which is less than the first gain bandwidth product.

Figure 7:
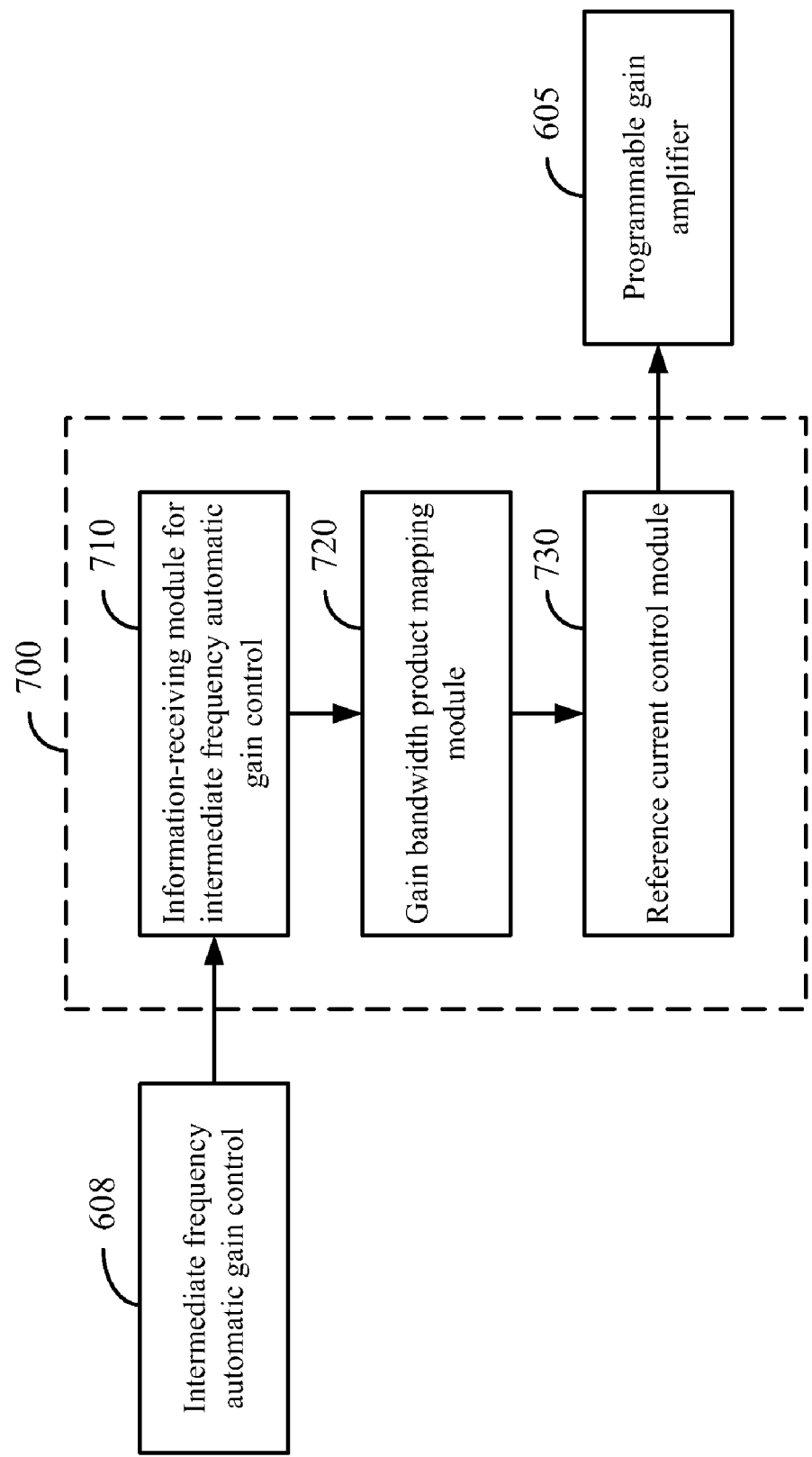
FIG. 7 is a schematic view diagram of the current-adjusting unit according to one embodiment of the present invention.

FIG. 7 is a schematic view diagram of the current-adjusting unit 700 according to one embodiment of the present invention. The current-adjusting unit 700 further includes an information-receiving module 710 for intermediate frequency automatic gain control, a gain bandwidth product mapping module 720, and a reference current control module 730. The information-receiving module 710 for intermediate frequency automatic gain control is coupled to the intermediate frequency automatic gain control 608 and receives the intermediate frequency automatic gain control information. The intermediate frequency automatic gain control information is a gain control signal which is adjusted according to the inputted signal of the programmable gain amplifier (PGA) 605. The gain bandwidth product mapping module 720 determines the optimal gain bandwidth product based on the intermediate frequency automatic gain control information. The reference current control module 730 generates a reference current which is corresponding to the optimal gain bandwidth product and supplies the reference current to the programmable gain amplifier (PGA) 605.

Figure 1:
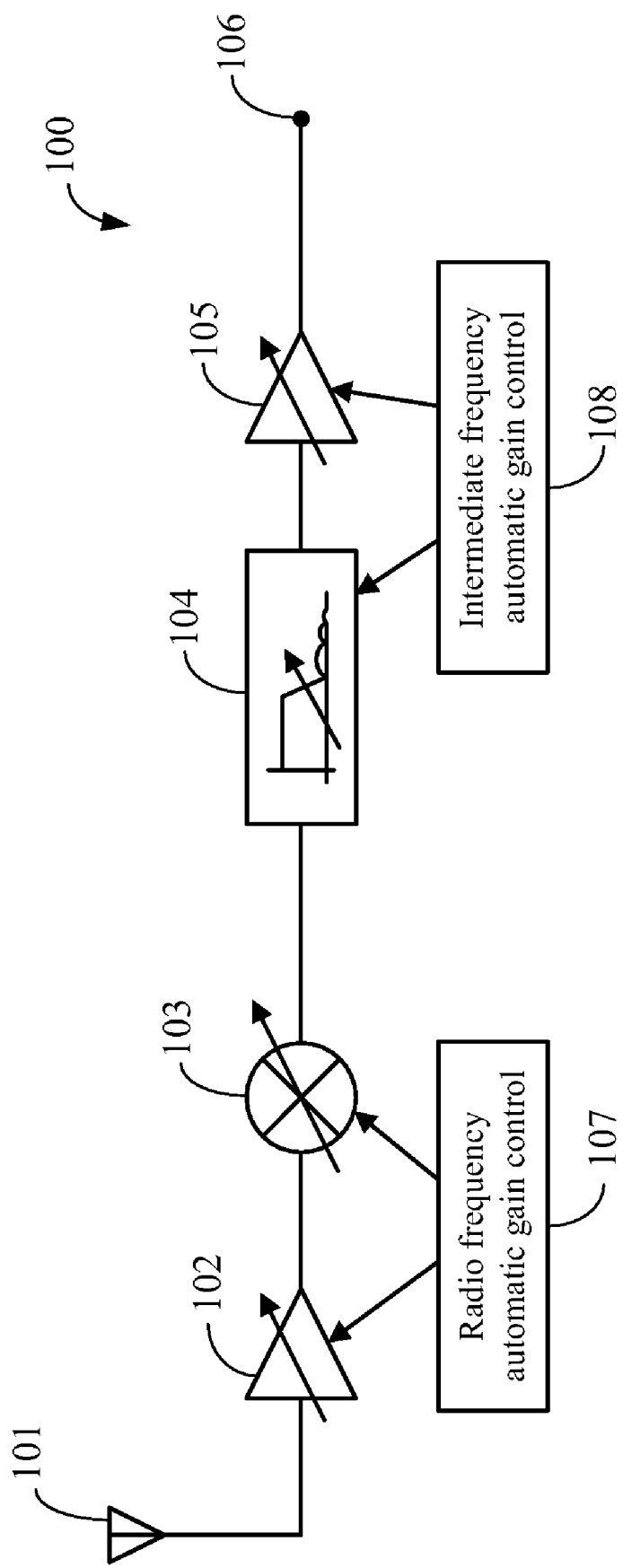
FIG. 1 is a schematic block diagram of a conventional receiver with a programmable gain amplifier.
Figure 2:
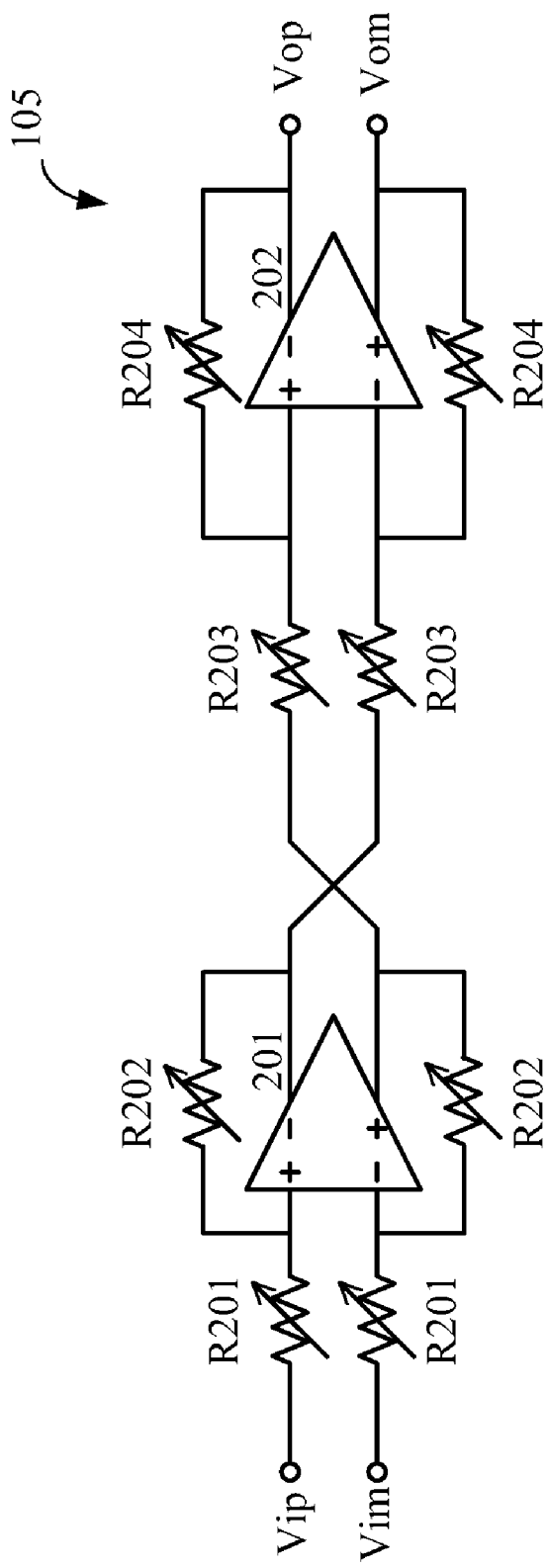
FIG. 2 is a schematic view of a conventional programmable gain amplifier implemented by operational amplifiers.
Figure 3:
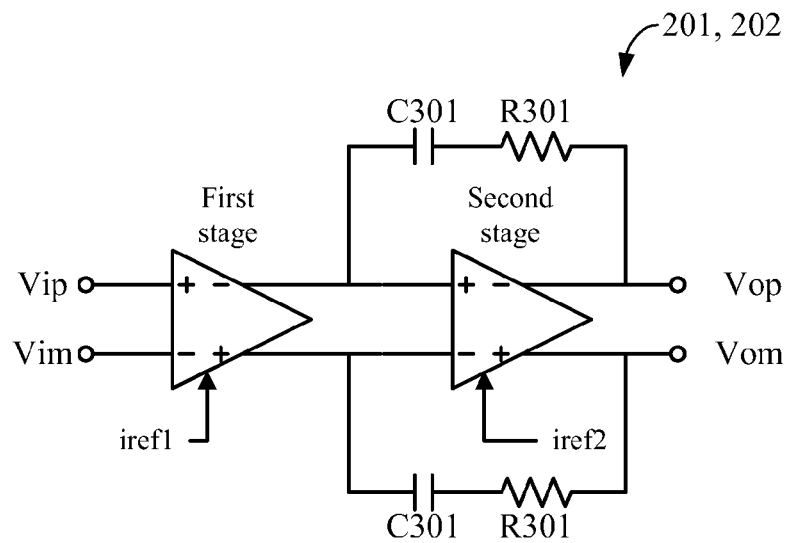
FIG. 3 is a schematic view of a two-stage operational amplifier of a programmable gain amplifier according to one embodiment of the present invention.

Please refer to FIGS. 2 and 3. FIG. 3 is a schematic view of a two-stage operational amplifier of the programmable gain amplifier (PGA) 605 according to one embodiment of the present invention. FIG. 2 is one embodiment in FIG. 3 of the present invention. The programmable gain amplifier (PGA) 605 includes a first operational amplifier 201 and a second operational amplifier 202, which are a two-stage amplifier.

The two-stage amplifier includes a loop circuit comprising capacitors C301 and resistors R301 and has input signals (Vip, Vim). The input signals (Vip, Vim) are directly inputted to the first stage circuit. The loop circuit composed of capacitors C301 and resistors R301 outputs the signal (Vip, Vim) from the second stage circuit. In addition, the first reference current (iref1) is exerted on the first stage circuit, and the second reference current (iref2) is exerted on the second stage circuit.

Figure 4:
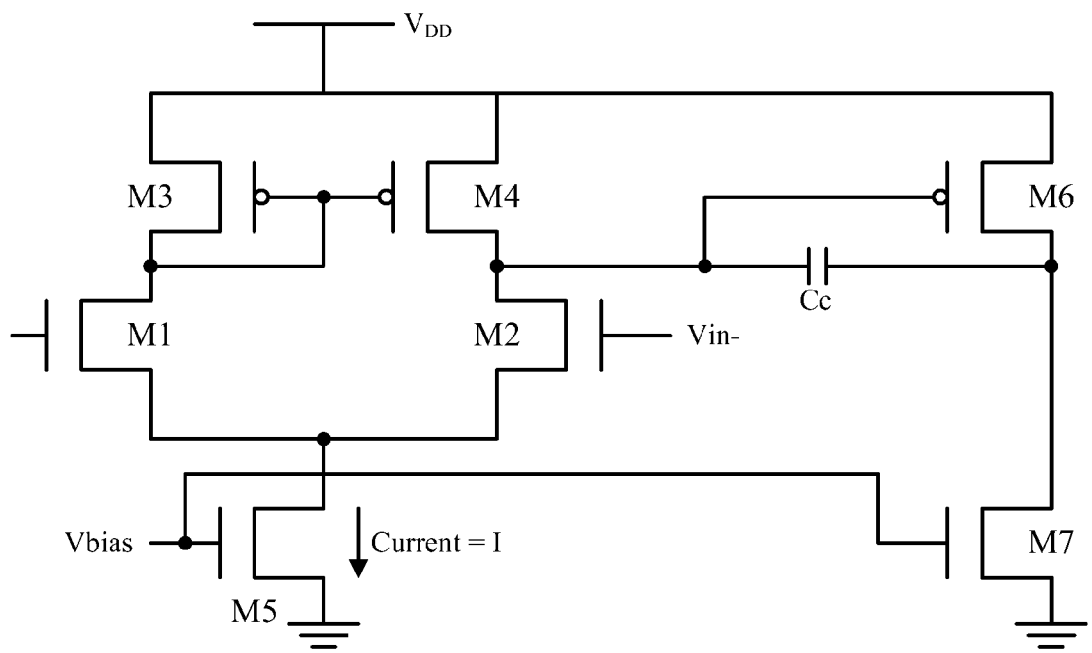
FIG. 4 is a schematic circuit view of the two-stage operational amplifier according to one embodiment of the present invention.
Figure 5:
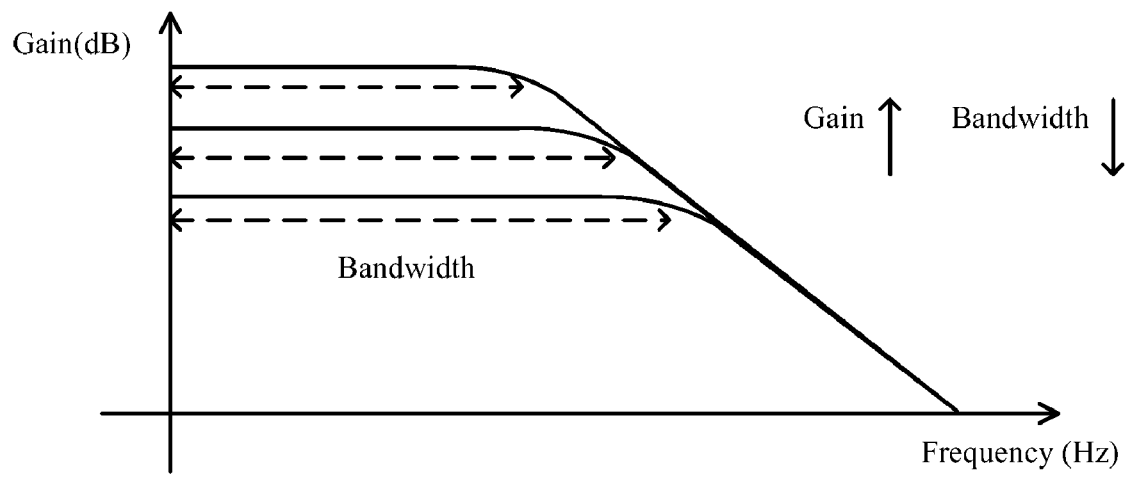
FIG. 5 is a schematic view of the relationship between the gain and frequency bandwidth of the conventional programmable gain amplifier.

Please refer to FIGS. 3 and 4. FIG. 4 is a schematic view of the circuit of the two-stage operational amplifier according to one embodiment of the present invention. FIG. 4 is one embodiment in FIG. 3 of the present invention. In the two-stage amplifier, from the first transistor "M1" to fifth transistor "M5" (i.e. "M1", "M2", "M3", "M4", and "M5") constructs a current mirror. The two-stage amplifier further includes a sixth transistor "M6" and seventh transistor "M7". The common electrode of the first transistor "M1" and the second transistor "M2" is connected to one electrode of the transistor "M5", wherein the gate of transistor "M5" is controlled by the voltage "Vbias". Additionally, another electrode of the transistor "M2" is connected to the gate of the transistor "M6". A capacitor "$C_c$" is positioned between the gate and one electrode of the transistor "M6". That is, one electrode of capacitor "$C_c$" is connected to one electrode of transistor "M6". The voltage "Vbias" is applied to the gate of transistor "M7".

As shown in following formula (E3), the gain of the two-stage amplifier is proportional to the transconductance "$g_m$" of the transistor "M1". As shown in following formula (E3), the transconductance $g_m$ of the transistor "M1" is proportional to the square root of current "I" of transistor "M5".

$$GBW = \frac{g_m}{C_c} \quad (E3)$$

$$g_m = \sqrt{2k' \times (W/L) \times I} \quad (E4)$$

Based on formulas (E3) and (E4), by decreasing the gain bandwidth product of the two-stage amplifier can effectively reduce the undue current supplied to the amplifier for saving the power consumption of the receiver 600.

When the gain bandwidth product of the first stage circuit in the two-stage amplifier is reduced, the overall gain of the amplifier is changed to a low level. However, based on formula 1 (E1), the transfer function of the programmable gain amplifier (PGA) 605 is represented by a plurality of resistors, which is uncorrelated with the gain of the operational amplifier. Therefore, while the supplied current is reduced by the present invention, the performance of the programmable gain amplifier (PGA) 605 is kept in a better mode all the time.

Please refer to FIGS. 6 and 7. In the current-adjusting unit 700, the programmable gain amplifier (PGA) 605 utilizes the intermediate frequency automatic gain control information to control the gain for determining the reference current of the optimal gain bandwidth product. The reference current control module 730 provides the reference current to a first stage amplifier of a two-stage amplifier in the programmable gain amplifier (PGA) 605.

The information-receiving module 710 for the intermediate frequency automatic gain control receives the intermediate frequency automatic gain control information. In one embodiment, the intermediate frequency automatic gain control information is the gain value of the programmable gain amplifier (PGA) 605. The gain value can be adjusted by the intermediate frequency automatic gain control (IF AGC) 608 according to the inputted signal of the programmable gain amplifier (PGA) 605. In other words, when the inputted signal of the programmable gain amplifier (PGA) 605 is in low level, the gain value of the programmable gain amplifier (PGA) 605 is increased. When the inputted signal of the programmable gain amplifier (PGA) 605 is in high level, the gain value of the programmable gain amplifier (PGA) 605 is decreased. When the inputted and outputted signals of the programmable gain amplifier (PGA) 605 are maintained at a predetermined level, the gain value of the programmable gain amplifier (PGA) 605 is constant, and the programmable gain amplifier (PGA) 605 is operated according to the constant gain value while the intermediate frequency automatic gain control (IF AGC) 608 is in an idle status. Therefore, based on the statuses of the inputted and outputted signals, the intermediate frequency automatic gain control information, e.g. the high gain, the low gain, or the constant gain, is received.

The gain bandwidth product mapping module 720 determines the optimal gain bandwidth product by mapping the gain used in the programmable gain amplifier (PGA) 605. While the programmable gain amplifier (PGA) 605 is in a status of high gain based on the intermediate frequency automatic gain control information, the gain bandwidth product mapping module 720 maps out the first gain bandwidth product, and the reference current control module 730 provides a high current, serving as the reference current, to the programmable gain amplifier (PGA) 605 based on the first gain bandwidth. While the programmable gain amplifier (PGA) 605 is in a status of low gain based on the intermediate frequency automatic gain control information, the gain bandwidth product mapping module 720 maps out the second gain bandwidth, and the reference current control module 730 provides a low current, serving as the reference current, to the programmable gain amplifier (PGA) 605 based on the second gain bandwidth. Since the mapping between the gain and the frequency bandwidth is performed in the present invention, the reduced (smaller) gain bandwidth product can satisfy the requirement of predetermined bandwidth (BW).

The reference current control module 730 controls the reference current of the first stage circuit in the two-stage amplifier. When the gain bandwidth product mapping module 720 maps out the first gain bandwidth product having a higher level, the reference current control module 730 provides a higher current, serving as the reference current, to the first stage circuit of the programmable gain amplifier (PGA) 605 based on the first gain bandwidth product. The higher current is computed by gain and bandwidth, i.e. the reference current can satisfy the requirement of the gain bandwidth product. When the gain bandwidth product mapping module 720 maps out the second gain bandwidth product having a lower level, the reference current control module 730 provides a lower current, serving as the reference current, to the first stage circuit of the programmable gain amplifier (PGA) 605 based on the second gain bandwidth product.

According to the above-mentioned descriptions, the receiver with low power consumption controls the gain of a programmable gain amplifier (PGA) 605 based on the input signal of the programmable gain amplifier (PGA) 605 to determine the gain bandwidth product. The determined gain bandwidth product is implemented by adjusting the reference current exerted on the first stage amplifier of at least two stage amplifiers in the programmable gain amplifier (PGA) 605. Therefore, a sufficient gain bandwidth product can be applied according to different gains, and minimizing the power consumption of the receiver due to undue current.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A receiver with low power consumption, wherein the receiver comprises a low noise amplifier, a frequency converter, a channel selection filter, a programmable gain amplifier and an intermediate frequency automatic gain control, and the low noise amplifier amplifies an ultra-high frequency signal received from an antenna, the frequency converter down-converts a frequency of the ultra-high frequency signal for outputting a down-converted signal, the channel selection filter filters away an interference signal from the down-converted signal, and the programmable gain amplifier amplifies the down-converted signal from the channel selection filter for outputting a gain-amplified signal having a predetermined value, and the intermediate frequency automatic gain control generates intermediate frequency automatic gain control information based on an inputted signal of the programmable gain amplifier to adjust the gain of the programmable gain amplifier, the receiver comprising:
a current-adjusting unit coupled to the intermediate frequency automatic gain control and the programmable gain amplifier, for receiving the intermediate frequency automatic gain control information, and for determining an optimal gain bandwidth product of the programmable gain amplifier according to the intermediate frequency automatic gain control information and a predetermined bandwidth in order to adjust the current provided for the programmable gain amplifier based on the optimal gain bandwidth product, wherein the optimal gain bandwidth product comprises a first gain bandwidth product and a second gain bandwidth product which is less than the first gain bandwidth product based on the predetermined bandwidth.

2. The receiver of claim 1, wherein the current-adjusting unit further comprises:
an information-receiving module for the intermediate frequency automatic gain control coupled to the intermediate frequency automatic gain control, for receiving the intermediate frequency automatic gain control information, wherein the intermediate frequency automatic gain control information is a gain control signal which can be adjusted according to the inputted signal of the programmable gain amplifier;
a gain bandwidth product mapping module, for determining the optimal gain bandwidth product based on the intermediate frequency automatic gain control information; and
a reference current control module, for generating a reference current which is corresponding to the optimal gain bandwidth and supplying the reference current to the programmable gain amplifier.

3. The receiver of claim 2, wherein while the programmable gain amplifier is in a status of high gain based on the intermediate frequency automatic gain control information, the gain bandwidth product mapping module maps out the first gain bandwidth product, and the reference current control module provides a high current, served as the reference current, to the programmable gain amplifier based on the first gain bandwidth product, and wherein while the programmable gain amplifier is in a status of low gain based on the intermediate frequency automatic gain control information, the gain bandwidth product mapping module maps out the second gain bandwidth product and the reference current control module provides a low current, served as the reference current, to the programmable gain amplifier based on the second gain bandwidth product.

4. The receiver of claim 2, wherein the reference current is provided for a first stage amplifier of at least two stage amplifiers in the programmable gain amplifier.

* * * * *